United States Patent
Yuan et al.

(10) Patent No.: US 9,761,469 B2
(45) Date of Patent: Sep. 12, 2017

(54) UNLOADING MECHANISM

(71) Applicant: ANHUI HONGQING PRECISION MACHINE CO., LTD., Anqing (CN)

(72) Inventors: Li-Cai Yuan, Shenzhen (CN); Tzyy-Chyi Tsai, New Taipei (TW); Dong-Sheng Lin, New Taipei (TW)

(73) Assignee: ANHUI HONGQING PRECISION MACHINE CO., LTD., Anqing (CN)

( * ) Notice: Subject to any disclaimer, the term of this patent is extended or adjusted under 35 U.S.C. 154(b) by 362 days.

(21) Appl. No.: 14/573,031

(22) Filed: Dec. 17, 2014

(65) Prior Publication Data
US 2015/0174764 A1    Jun. 25, 2015

(30) Foreign Application Priority Data
Dec. 19, 2013 (CN) .......................... 2013 1 0701246

(51) Int. Cl.
*B25J 11/00* (2006.01)
*H01L 21/67* (2006.01)

(52) U.S. Cl.
CPC .............................. *H01L 21/67132* (2013.01)

(58) Field of Classification Search
CPC ....................... H01L 21/67132; H05K 13/0069
USPC .......................... 414/737, 752.1; 294/65, 188
See application file for complete search history.

(56) References Cited

U.S. PATENT DOCUMENTS

| 8,251,422 B2* | 8/2012 | Cheng ............... H01L 21/67333 294/188 |
| 8,590,954 B2* | 11/2013 | Hummeler .............. B65B 35/38 198/468.3 |
| 2010/0144120 A1* | 6/2010 | Segawa ............. H01L 21/67132 438/464 |

* cited by examiner

*Primary Examiner* — Scott Lowe
(74) *Attorney, Agent, or Firm* — Steven Reiss

(57) ABSTRACT

An unloading mechanism for removing workpieces from a transporting film can include a bottom plate, a picking assembly, and a storage assembly. The picking assembly can include a driving member coupled to the bottom plate, a pressing member coupled to the driving member, and a picking member coupled to the pressing member. The pressing member can define a receiving hole along an axis. The picking member can include a connecting rod coupled to the bottom plate, and a suction member coupled to the connecting rod. The suction member can be coupled to the second end and protruding out of the pressing member. The storage assembly can include a base plate configured to support the transporting film, and a pressing plate stacked on the base plate and the transporting film.

20 Claims, 5 Drawing Sheets

UNLOADING MECHANISM

FIELD

The subject matter herein generally relates to unloading mechanisms, and particularly relates to an unloading mechanism applied to workpieces pasted on a transporting film.

BACKGROUND

In order to conveniently transport miniaturized workpieces, a plurality of miniaturized workpieces can be pasted on a transporting film. Before being machined, the workpieces should be removed from the transporting film and positioned on a fixture. An unloading mechanism can be used when removing and positioning.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
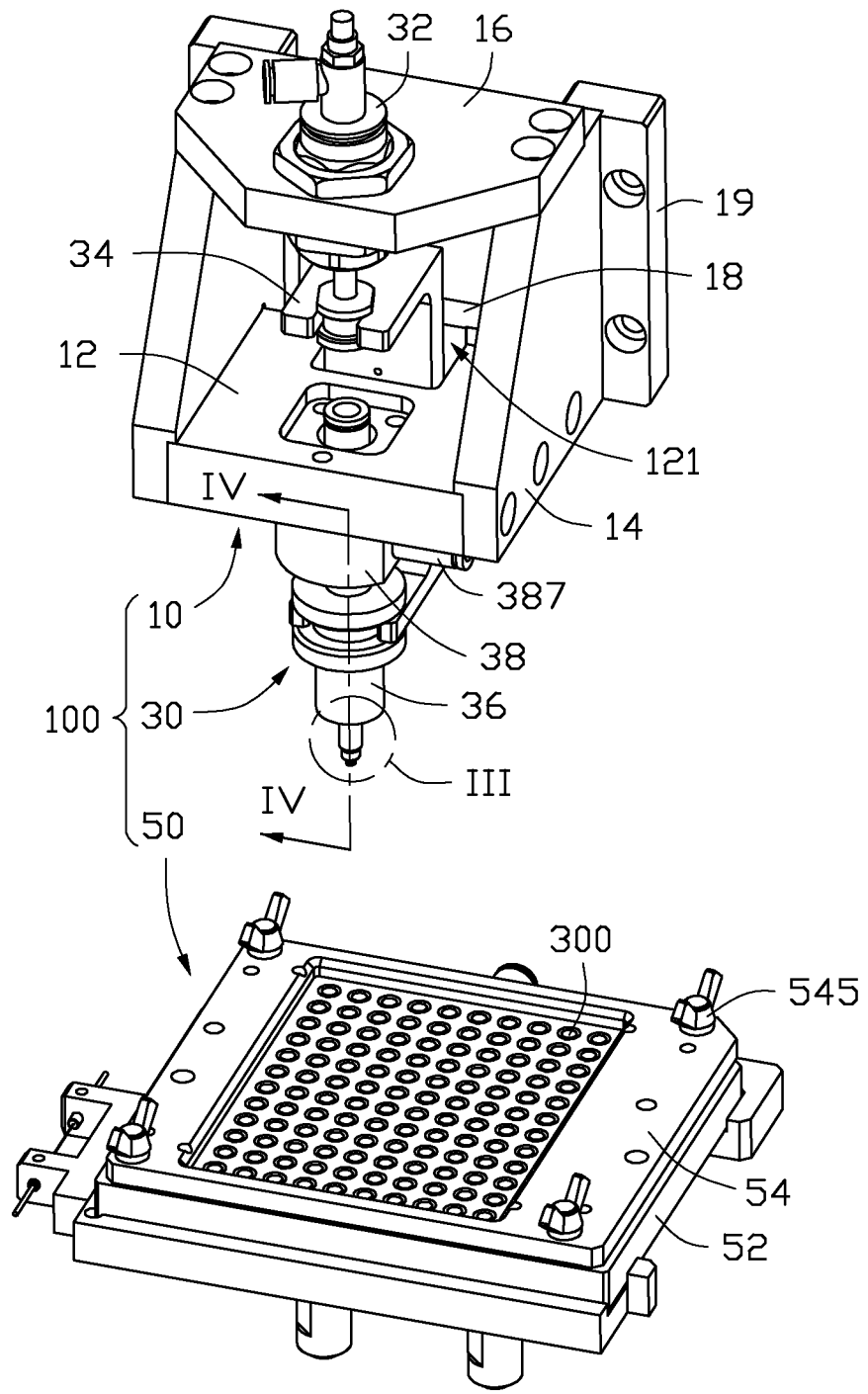
FIG. 1 is an isometric view of an embodiment of an unloading mechanism, the unloading mechanism including a mounting assembly, picking assembly, and a storage assembly.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series and the like.

The present disclosure is described in relation to unloading mechanisms, and particularly relates to an unloading mechanism applied to workpieces arranged on a transporting film.

An unloading mechanism for removing workpieces from a transporting film can include a bottom plate, a picking assembly coupled to the bottom plate, and a storage assembly adjacent to the picking assembly. The picking assembly can include a driving member coupled to the bottom plate, a pressing member coupled to the driving member, and a picking member coupled to the pressing member. The pressing member can define a receiving hole along an axis. The picking member can include a connecting rod coupled to the bottom plate, and a suction member coupled to the connecting rod. The connecting rod can include a first end and a second end positioned opposite to the first end. The first end can be coupled to the bottom plate; the second end can be movably received in the receiving hole. The suction member can be coupled to the second end and protrude out of the pressing member. The storage assembly can include a base plate configured to support the transporting film, and a pressing plate stacked on the base plate and the transporting film. The pressing plate can define a plurality of holes corresponding to the workpieces on the transporting film. Each of the holes can be configured to receive a workpiece. The suction member can be configured to insert into one of the holes and suction to the workpiece. The driving member can be configured to move the pressing member towards and push the transporting film, enabling the suction member to remove the workpiece from the transporting film.

Figure 5:
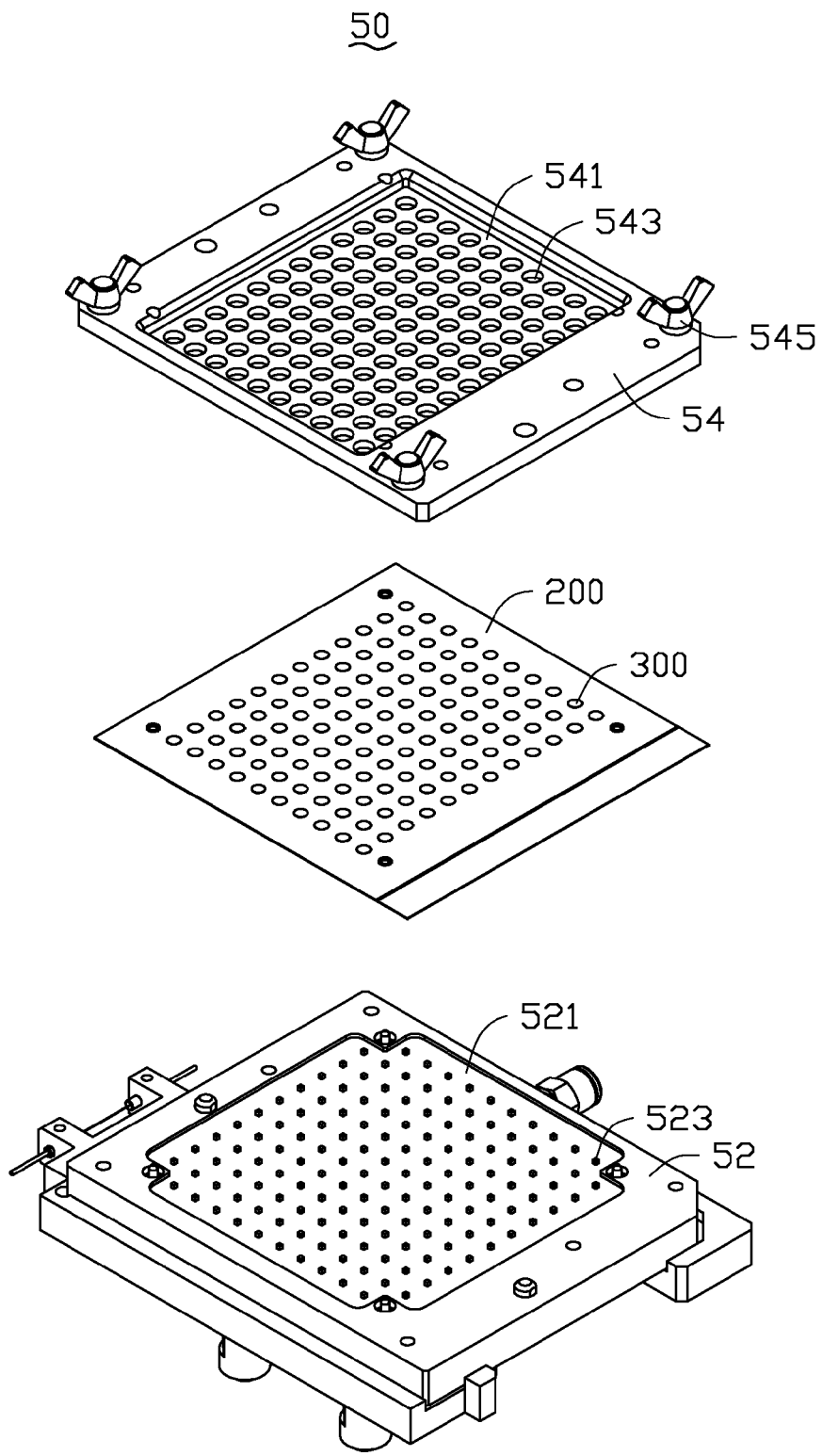
FIG. 5 is an exploded, isometric view of the picking assembly of the unloading mechanism of FIG. 1.

FIG. 1 illustrates an embodiment of an unloading mechanism 100 configured to cooperate with an external mechanism arm (not shown) to remove workpieces 300 pasted on a transporting film 200 (shown in FIG. 5). In the illustrated embodiment, the workpiece 300 can be a minimize slice. A plurality of workpieces 300 can be pasted on a transporting film 200 spaced apart from each other. The unloading mechanism 100 can include a mounting assembly 10, a picking assembly 30 coupled to the mounting assembly 10, and a storage assembly 50 adjacent to the picking assembly 30.

Figure 2:
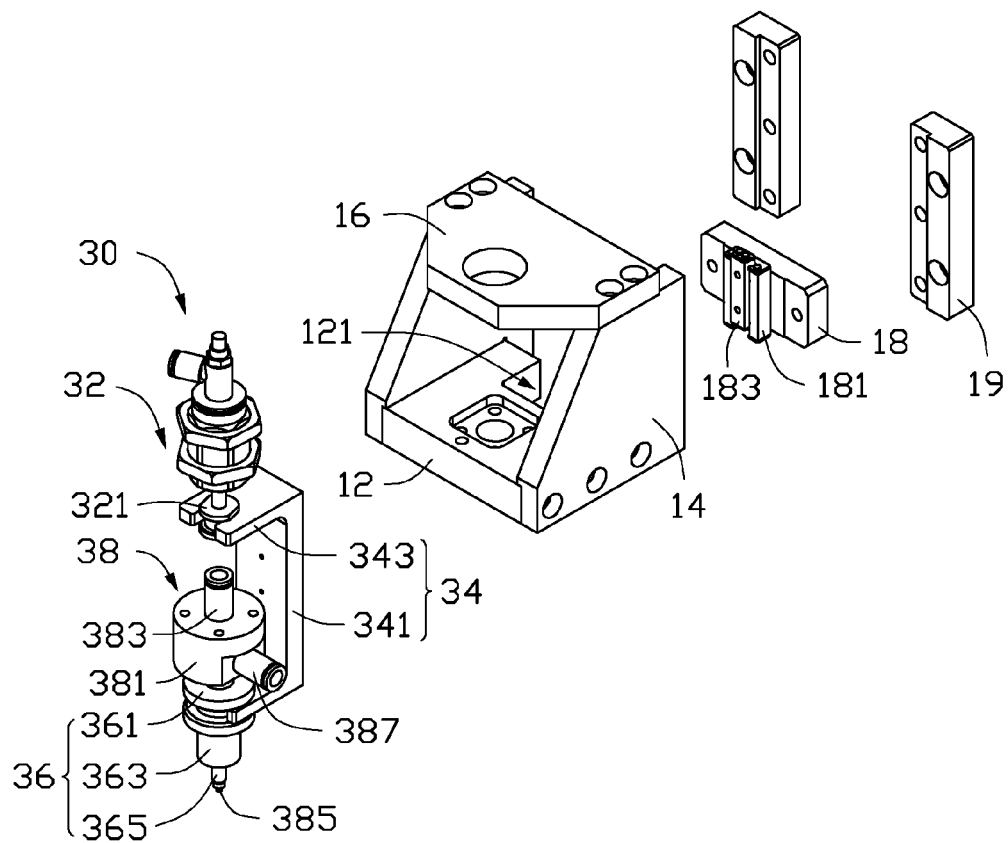
FIG. 2 is an exploded, isometric view of the mounting assembly and the picking assembly of the unloading mechanism of FIG. 1.

FIG. 2 illustrates that the mounting assembly 10 can include a bottom plate 12, two sideboards 14 respectively coupled to opposite sides of the bottom plate 12, a top plate 16 coupled to the two sideboards 14, a first mounting member 18 coupled to the bottom plate 12, and two second mounting members 19 respectively coupled to the sideboards 14.

The bottom plate 12 can define a receiving slot 121 at a sidewall. The receiving slot 121 can be configured to partially receive the first mounting member 18. The two sideboards 14 can be mounted to the bottom plate 12 parallel to each other, and positioned at opposite sides of the receiving slot 121, respectively. The top plate 16 can be mounted to ends of the sideboards 14 away from the bottom plate 12, parallel to the bottom plate 12. The top plate 16 can be configured to support the picking assembly 30. The first mounting member 18 can be mounted to a side of the bottom plate 12 and can cover the receiving slot 121. The first mounting member 18 can provide a guiding rail 181 and a sliding block 183 coupled to the guiding rail 181. The guiding rail 181 can extend along a direction perpendicular to the bottom plate 12. The sliding block 183 can be capable of sliding on the guiding rail 181. The guiding rail 181 and the sliding block 183 can be configured to guide the picking assembly 30 along the direction perpendicular to the bottom plate 12. The two second mounting members 19 can be mounted to the two sideboards 14, respectively, and can be adjacent to the first mounting member 18. The second mounting members 19 can be configured to couple to the external mechanical arm.

The picking assembly 30 can include a driving member 32, a mounting member 34, a pressing member 36 and a picking member 38. The driving member 32 and the pressing member 36 can be coupled to two ends of the mounting member 34. The picking member 38 can be coupled on the pressing member 36.

The driving member 32 can be mounted to the top plate 16. In the illustrated embodiment, the driving member 32 can be a cylinder, which can include a drive end 321. The drive end 321 can extend towards the bottom plate 12.

The mounting member 34 is a substantially U-shaped structure which can include a main body 341, and two bent portions 343 formed on the main body 341. The main body 341 can be a substantially rectangular plate, and can be fixed to the sliding block 183 perpendicular to the bottom plate 32. The main body 341 can pass through the receiving slot 121. The two bent portions 343 can be formed at opposite ends of the main body 341, respectively, and can be bent extending along a direction parallel to the bottom plate 12. The two bent portions 343 can be located at opposite sides of the bottom plate 12. One of the two bent portions 343 adjacent to the top plate 16 can be coupled to the drive end 321 of the driving member 32. The driving member 32 can be configured to move the mounting member 34 along the guiding rail 181.

Figure 3:
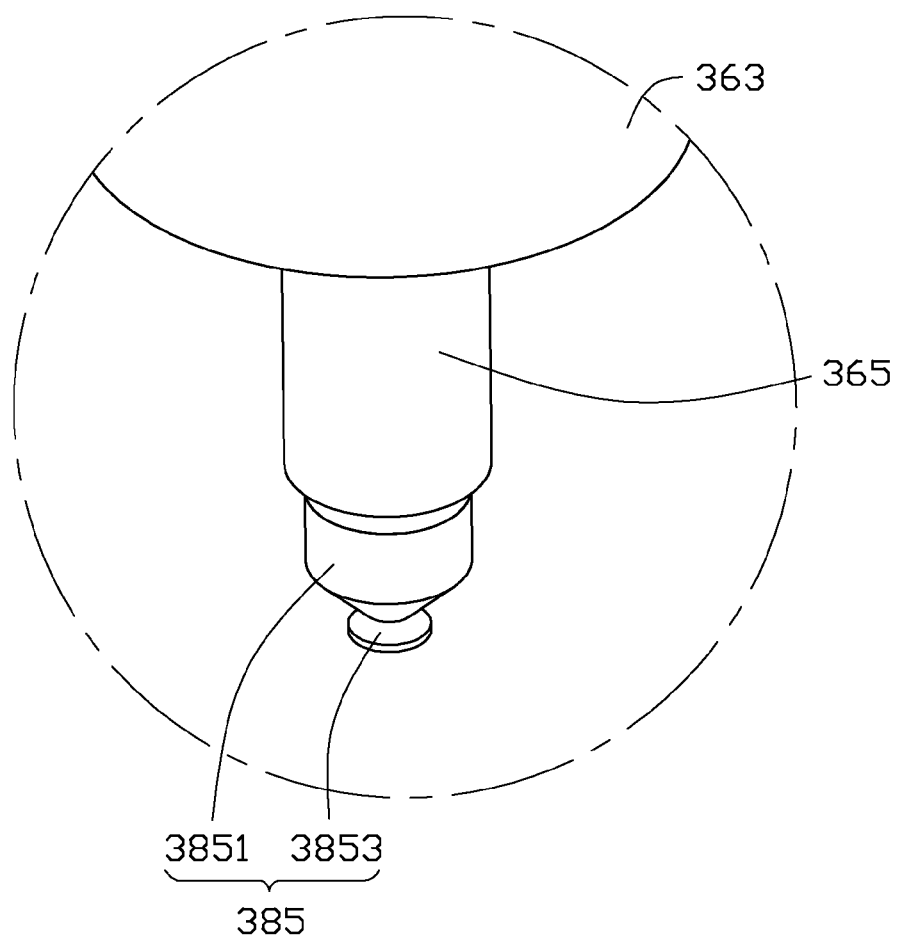
FIG. 3 is an enlarged view of the area III of FIG. 1
Figure 4:
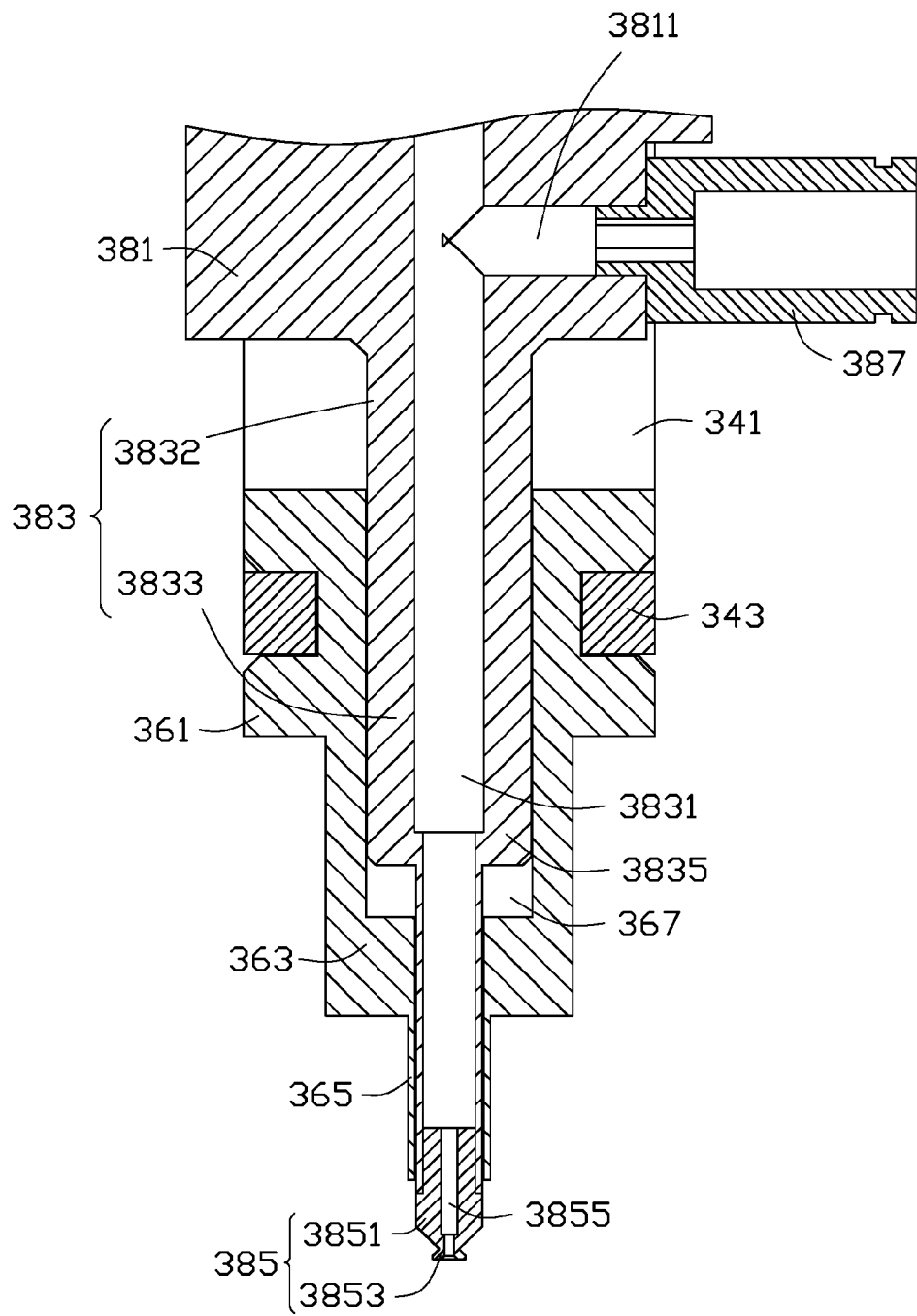
FIG. 4 is a cross-sectional view of the unloading mechanism of FIG. 1, taken along line IV-IV.

FIGS. 3 and 4 illustrate that the pressing member 36 can be a substantially hollow cylinder, and can be coupled to the other one of the two bent portions 343 away from the driving member 32. The pressing member 36 can include a connecting portion 361, a cylindrical body 363 formed on the connecting portion 361, and a resisting portion 365 formed on the cylindrical body 363. The connecting portion 361 can be fixed to the bent portion 343. The cylindrical body 363 can protrude from an end of the connecting portion 361 away from the driving member 32. The resisting portion 365 can be protruded from an end of the cylindrical body 363 away from the connecting portion 361. A diameter of the resisting portion 365 can be less than that of the cylindrical body 363 and greater than that of the workpiece 300. The pressing member 36 can define a receiving hole 367 along an axis. The receiving hole 367 can extend through the connecting portion 361, the cylindrical body 363, and the resisting portion 365, and can be configured to partially receive the picking member 38.

The picking member 38 can be mounted to a surface of the bottom plate 12 away from the top plate 16, and can be partially received in the receiving hole 367. The picking member 38 can be configured to suction to one of the workpiece 300 on the transporting film 200. The picking member 38 can include a mounting portion 381, a connecting rod 383, a suction member 385, and a joint 387.

The mounting portion 381 can be a substantially cylindrical block, and can be fixed to the bottom plate 12. The mounting portion 381 can define a through the hole 3811 on a periphery. The through hole 3811 can extend along a radial direction of the mounting portion 381.

The connecting rod 383 can be formed at an end of the mounting portion 381 away from the bottom plate 12, and can be movably received in the receiving hole 367. The connecting rod 383 can include a first end 3832 coupled to the mounting portion 381, and a second end 3833 received in the receiving hole 367. When the driving member 32 moves the pressing member 36, the connecting rod 383 can slide in the receiving hole 367, such that second end 3833 of the connecting rod 383 away from the mounting portion 381 can be protruded out of the pressing member 36, or to retract into and be received in the receiving hole 367. The connecting rod 383 can be a substantially hollow structure, and can define a first air inlet 3831 along an axis. The first air inlet 3831 can extend through the connecting rod 383 to communicate with the through hole 3811, and finally extends through the mounting portion 3811 along the axis.

The suction member 385 can be coupled to an end of connecting rod 383 away from the mounting portion 381, and can be configured to suction to one of the workpieces 300 on the transporting film 200. When the driving member 32 moves the pressing member 36 relative to the connecting rod 383, the suction member 385 can protrude out of or retract into the receiving hole 367 when driven by the connecting rod 383. The suction member 385 can include a suction tube 3851 and a suction portion 3853 formed on the suction tube 3851. An end of the suction tube 3851 can be received in the first air inlet 3831, coupled to the connecting rod 383. The suction portion 3853 can be substantially a suction cup, and can be formed at an end of the suction tube 3851. The suction member 385 can define a second air inlet 3855 along an axis. The second air inlet 3855 can extend through the suction tube 3851 and the suction portion 3853, and can communicate with the first air inlet 3831. In the illustrated embodiment, the suction member 385 can be made from rubber.

The joint 387 can be mounted to the periphery of the mounting portion 381, and can be configured to couple with an external air resource. The first air inlet 3831 can communicate with the external air resource via the through hole 3811 and the joint 387, such that the suction portion 3853 can suction to a workpiece 300 on the transporting film 200 when the external air resource suctions the air.

FIG. 5 illustrates that the storage assembly 50 can include a base plate 52 and a pressing plate 54. The base plate 52 can be a substantially rectangular plate, and can be positioned on an external workbench (not shown).

The base plate 52 can define a receiving portion 521 at a surface facing the suction portion 3853. The receiving portion 521 can be configured to receive the transporting film 200 with the workpieces 200. The receiving portion 521 can provide a plurality of protruding portions 523. The protruding portions 523 can be spaced apart from each other and can extend towards the picking assembly 30. Each of the plurality of the protruding portions 523 can be corresponding to one of the plurality of the workpieces 300 on the transporting film 200.

The pressing plate 54 can be stacked on the base plate 52, and can be configured to press the transporting film 300 to the receiving portion 521 and the protruding portions 523. The pressing plate 54 can define a pressing portion 541 corresponding to the receiving portion 521, and a plurality of holes 543 on the pressing portion 541. The holes 543 can extend through the pressing portion 541. Each of the plurality of the holes 543 can be correspond to each of the plurality of the protruding portions 523. The workpieces 200 can be received in the corresponding holes when the transporting film 200 is positioned on the receiving portion 521.

The holes 543 can be configured to receive the resisting portion 365 and the suction member 385, such that the suction member 385 can be inserted into one of the holes 543 and suction to the workpiece 200 received in the hole 543. The pressing plate 54 can provide a plurality of locking members 545 at a side away from the base plate 52. The locking members 545 can be inserted through the pressing plate 54 and threaded onto the base plate 52, and can be configured to fix the pressing plate 54 to the base plate 52.

In assembly, the sideboards 14 can be mounted to the bottom plate 12, the top plate 16 can be coupled to the sideboards 14. The driving member 32 can be coupled to the top plate 16. The mounting member 34 can be coupled to the sliding block 183 on the first mounting member 18. The first mounting member 18 can be mounted to the bottom plate 12. One of the bent portions 343 of the mounting member 34 can be coupled to the drive end 321 of the driving member. The mounting portion 381 of the picking member 38 can be coupled to the bottom plate 12. The joint 387 of the picking member 38 can be coupled to the external air resource. The pressing member 36 can be sleeved onto the connecting rod 383 and coupled to one of the bent portions 343, the suction member 385 can partially protrude from the receiving hole 367 and the resisting portion 365. The second mounting members 19 can be mounted to the sideboards 14.

In operation, the base plate 52 can be mounted to the external workbench (not shown), the transporting film 200 with the plurality of workpieces 300 can be positioned in the receiving portion 521, such that each of the workpieces 300 can correspond to each of the protruding portions 523. The pressing plate 54 can be stacked on the base plate 52, and can be fixed to the base plate 52 via the locking member 545. The mounting assembly 10 and the picking assembly 30 can be coupled to the external mechanical arm (not shown) via the second mounting member 19. The mechanical arm can move the picking assembly 30 to the pressing plate 54, and the suction portion 3853 can be aligned to one of the plurality of holes 543. The mechanical arm can keep the picking assembly 30 moving to the pressing plate 54, the suction portion 3853 can be inserted into the corresponding hole 543 and can resist against a workpiece 200. The external air resource can suction the air, enabling the suction portion 3853 to suction to the workpiece 200. The driving member 32 can move the mounting member 34 and the pressing member 36 towards the pressing plate 54, such that the resisting portion 365 can be inserted into the hole 543 and can resist against the transporting film 200 around the workpiece 300. The driving member 32 can keep the pressing member 36 moving; the resisting portion 365 can push the transporting film 200 away from the suction member 385. Thereby the transporting film 200 can be separated from the workpiece 300, and the workpiece 300 can be adhered on the suction portion 3853.

In an alternative embodiment, the sideboards 14, the top plate 16, the first mounting member 18, and the second mounting member 19 can be omitted. Such that the driving member 32 can be mounted to the bottom plate 12 in assembly, and the bottom plate 12 can be mounted to the mechanical arm in operation.

In an alternative embodiment, the mounting portion 381 can be omitted. Such that the connecting rod 383 can be mounted to the bottom plate 12, the joint 387 can be coupled to the connecting rod 383.

In an alternative embodiment, the suction member 385 can be other structures, for example, but not limited to, the suction member 385 can be magnetic.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure, as defined by the appended claims.

What is claimed is:

1. An unloading mechanism for removing workpieces from a transporting film, the unloading mechanism comprising:
    a bottom plate;
    a picking assembly coupled to the bottom plate, the picking assembly comprising:
        a driving member coupled to the bottom plate;
        a pressing member coupled to the driving member, the pressing member having a receiving hole therein along an axis thereof; and
        a picking member comprising:
            a connecting rod having a first end and a second end positioned oppositely to the first end, the first end coupled to the bottom plate, the second end movably received in the receiving hole; and
            a suction member coupled to the second end and protruding out of the pressing member; and
    a storage assembly adjacent to the picking assembly, the storage assembly comprising:
        a base plate configured to support the transporting film; and
        a pressing plate stacked on the base plate and the transporting film;
    wherein the pressing plate defines a plurality of holes corresponding to the workpieces on the transporting film, each of the holes is configured to receive a workpiece; the suction member is configured to insert into the hole and suction to the workpiece; and
    wherein the driving member is configured to move the pressing member towards and push the transporting film, enabling the suction member to remove the workpiece from the transporting film.

2. The unloading mechanism of claim 1, wherein the picking member comprises a mounting portion coupled to the bottom plate, a joint coupled to the mounting portion; the joint is configured to couple with an external air resource; the mounting portion defines a through hole; the connecting rod is coupled to the mounting portion and defines a first air inlet communicating with the through hole; the suction member defines a second air inlet communicating with the first air inlet; the suction member is configured to communicate with the external air resource via the connecting rod and the joint.

3. The unloading mechanism of claim 2, wherein the suction member comprises a suction tube coupled to the connecting rod, and a suction portion formed on the suction tube; the second air inlet extends through the suction tube and the suction portion.

4. The unloading mechanism of claim 1, wherein the picking assembly further comprises a mounting member, the mounting member comprises a main body and two bent portions; the two bent portions coupled to opposite ends of the main body, respectively; one of the bent portions is coupled to the driving member, the other bent portion is coupled to the pressing member.

5. The unloading mechanism of claim 4, wherein the pressing member comprises a connecting portion coupled to the correspond bent portion, a cylindrical body coupled on the connecting portion, a resisting portion coupled to the cylindrical body; the receiving hole extends through the connecting portion, the cylindrical body, and the resisting portion; the driving member is configured to move the resisting portion to push the transporting film away from the workpiece.

6. The unloading mechanism of claim 4, wherein the bottom plate defines a receiving slot at a side thereof; the unloading mechanism further comprises a first mounting member coupled to the bottom plate adjacent to the receiving slot, a guiding rail coupled to the first mounting member, and a sliding block coupled to the guiding rail; the main body extends through the receiving slot such that the bent portions are respectively positioned at opposite sides of the bottom plate; the driving member is configured to move the mounting member along a longitude of the guiding rail.

7. The unloading mechanism of claim 1, wherein the unloading mechanism further comprises two sideboards respectively coupled to opposite sides of the bottom plate, a top plate is coupled to the sideboards, and the driving member is coupled to the top plate.

8. The unloading mechanism of claim 7, wherein the unloading mechanism further comprises two second mounting members respectively coupled to the sideboards configured to couple to an external mechanical arm.

9. The unloading mechanism of claim 1, wherein the base plate defines a receiving portion configured to receive the transporting film, the pressing plate defines a pressing portion corresponding to the receiving portion, and the holes are defined on the pressing portion.

10. The unloading mechanism of claim 9, wherein the base plate comprises a plurality of protruding portions on the receiving portion; each of the protruding portions is corresponding to each of the holes.

11. The unloading mechanism of claim 1, wherein the storage assembly further comprises a locking member configured to fix the pressing plate to the base plate, the locking member extends through the pressing plate and threads onto the base plate.

12. An unloading mechanism comprising:
a bottom plate;
a picking assembly coupled to the bottom plate; the picking assembly comprises:
a driving member coupled to the bottom plate;
a pressing member coupled to the driving member, the pressing member having a receiving hole therein along an axis thereof; and
a picking member comprising:
a connecting rod having a first end and a second end positioned oppositely to the first end, the first end coupled to the bottom plate, the second end movably received in the receiving hole; and
a suction member coupled to the second end and protruding out of the pressing member; and
a storage assembly adjacent to the picking assembly, the storage assembly comprising:
a base plate configured to support a transporting film with a plurality of workpieces; and
a pressing plate stacked on the base plate and the transporting film; wherein the pressing plate defines a plurality of holes; the suction member is configured to insert into the hole; and the driving member is configured to move the pressing member towards the base plate and push the transporting film, enabling the suction member to remove the workpiece from the transporting film.

13. The unloading mechanism of claim 12, wherein the picking member comprises a mounting portion coupled to the bottom plate, a joint coupled to the mounting portion; the joint is configured to couple with an external air resource; the mounting portion defines a through hole; the connecting rod is coupled to the mounting portion and defines a first air inlet communicating with the through hole; the suction member defines a second air inlet communicating with the first air inlet; and the suction member is configured to communicate with the external air resource via the connecting rod and the joint.

14. The unloading mechanism of claim 13, wherein the suction member comprises a suction tube coupled to the connecting rod, and a suction portion formed on the suction tube; the second air inlet extends through the suction tube and the suction portion.

15. The unloading mechanism of claim 12, wherein the picking assembly further comprises a mounting member, the mounting member comprises a main body and two bent portions; the two bent portions is coupled to opposite ends of the main body, respectively; one of the bent portions is coupled to the driving member, the other bent portion is coupled to the pressing member.

16. The unloading mechanism of claim 15, wherein the pressing member comprises a connecting portion coupled to the correspond bent portion, a cylindrical body coupled on the connecting portion, a resisting portion coupled to the cylindrical body; the receiving hole extends through the connecting portion, the cylindrical body, and the resisting portion; the driving member is configured to move the resisting portion towards the base plate.

17. The unloading mechanism of claim 15, wherein the bottom plate defines a receiving slot at a side thereof; the unloading mechanism further comprises a first mounting member coupled to the bottom plate adjacent to the receiving slot, a guiding rail coupled to the first mounting member, and a sliding block coupled to the guiding rail; the main body extends through the receiving slot such that the bent portions are respectively positioned at opposite sides of the bottom plate; the driving member is configured to move the mounting member along a longitude of the guiding rail.

18. The unloading mechanism of claim 12, wherein the unloading mechanism further comprises two sideboards respectively coupled to opposite side of the bottom plate, and a top plate coupled to the sideboards; the driving member is coupled to the top plate.

19. The unloading mechanism of claim 12, wherein the base plate comprises a receiving portion and a plurality of protruding portions on the receiving portion; the pressing plate defines a pressing portion corresponding to the receiving portion; the holes are defined on the pressing portion, each of the holes is corresponding to each of the protruding portions.

20. An unloading mechanism for removing a plurality of workpieces from a transporting film, the unloading mechanism comprising:
a bottom plate;
a driving member coupled to the bottom plate;
a pressing member coupled to the driving member, the pressing member having a receiving hole therein along an axis thereof;
a picking member comprising:
a connecting rod having a first end and a second end positioned oppositely to the first end, the first end coupled to the bottom plate, the second end movably received in the receiving hole; and
a suction member coupled to the second end and protruding out of the pressing member; and a base plate configured to support the transporting film; wherein the base plate comprises a plurality of protruding portions corresponding to the plurality of workpieces on the transporting film; the suction member is configured to suction to the workpiece; the driving member is configured to move the pressing member towards and push the transporting film on the base plate, enabling the suction member to remove the workpiece from the transporting film.

* * * * *